United States Patent
Lin

(10) Patent No.: US 7,213,187 B2
(45) Date of Patent: May 1, 2007

(54) DIGITAL LOGIC TEST METHOD TO SYSTEMATICALLY APPROACH FUNCTIONAL COVERAGE COMPLETELY AND RELATED APPARATUS AND SYSTEM

(75) Inventor: Chih-Wen Lin, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 134 days.

(21) Appl. No.: 10/905,734

(22) Filed: Jan. 19, 2005

(65) Prior Publication Data

US 2006/0161828 A1    Jul. 20, 2006

(51) Int. Cl.
*G01R 31/28* (2006.01)
(52) U.S. Cl. .................. 714/738; 714/742; 714/25; 703/22; 702/119; 716/4
(58) Field of Classification Search .......... None
See application file for complete search history.

(56) References Cited

U.S. PATENT DOCUMENTS

2002/0084273 A1* 7/2002 Ming .................. 220/4.28

OTHER PUBLICATIONS

Adir et al., "Piparazzi: A Test Program Generator for Micro-architecture Flow Verification", Jun. 3, 2003, IEEE 10.1109/HLDVT 2003. 1252470, pp. 23-28.*
Adir et al., "Genesys-Pro: Inovations in Test Program Generation for Functional Processor Verification", Mar.-Apr. 2004, IEEE 10.1109/MDT.2004. 1277900, pp. 84-93.*
Freescale Semiconductor, "MCF547X Family Integrated Microprocessor Product Brief", Rev. 1.3, Sep. 2004, pp. 1-15.*

* cited by examiner

*Primary Examiner*—Guy Lamarre
*Assistant Examiner*—John P. Trimmings
(74) *Attorney, Agent, or Firm*—Winston Hsu

(57) ABSTRACT

A digital logic test method for systematically testing a pipeline-structured integrated circuit chip is disclosed. The method includes the steps of: providing an integrated circuit chip capable of executing a plurality of instructions during a period of time, each of the instructions being executed according to a plurality of sequentially ordered operation segments, sorting the instructions, and designing a plurality of test patterns to test the integrated circuit according to the sorting result and STAGE test segments corresponding to the STAGE operation segments.

13 Claims, 4 Drawing Sheets

| Instruction no. | Instruction type | | | | | T1 | T2 | T3 | T4 | T5 | T6 | T7 | T8 | T9 | T10 | | |
|---|---|---|---|---|---|---|---|---|---|---|---|---|---|---|---|---|---|
| n | ALU1 | F | D | E | M | W | | | | | | | | | | | |
| n+1 | Load | | F | D | E | M | W | | | | | | | | | | |
| n+2 | ALU2 | | | F | D | E | M | W | | | | | | | | | |
| n+3 | ALU2 | | | | F | D | E | M | W | | | | | | | | |
| n+4 | Multiplier | | | | | F | D | E | M | W | | | | | | | |
| n+5 | Load | | | | | | F | D | E | M | W | | | | | | |
| n+6 | ALU1 | | | | | | | F | D | E | M | W | | | | | |
| n+7 | Branch | | | | | | | | F | D | E | M | W | | | | |
| n+8 | Store | | | | | | | | | F | D | E | M | W | | | |
| n+9 | ALU1 | | | | | | | | | | F | D | E | M | W | | |
| n+10 | ALU1 | | | | | | | | | | | F | D | E | M | W | |
| n+11 | Multiplier | | | | | | | | | | | | F | D | E | M | W |
| n+12 | Load | | | | | | | | | | | | | F | D | E | M |
| n+13 | ALU1 | | | | | | | | | | | | | | F | D | E |
| n+14 | Branch | | | | | | | | | | | | | | | F | D |
| n+15 | Store | | | | | | | | | | | | | | | | F |

| Instruction no. | Instruction | Instruction type | Instruction type no. |
|---|---|---|---|
| n | ADD r1,r2,r3 | ALU₁ | 0 |
| n+1 | LDR r2,[r6],#4 | Load | 1 |
| n+2 | MOV r0,r2,LSL #0 | ALU₂ | 2 |
| n+3 | MOV r1,r2,LSL #1 | ALU₂ | 2 |
| n+4 | MUL r0,r1,r0 | Multiplier | 3 |
| n+5 | LDR r3,[r7],#4 | Load | 1 |
| n+6 | CMP r0,r3 | ALU₁ | 0 |
| n+7 | BNE 0x100 | Branch | 4 |
| n+8 | STR r0,[r0] | Store | 5 |
| n+9 | MOV r0,r2,LSL #0 | ALU₁ | 0 |
| n+10 | MOV r1,r2,LSL #1 | ALU₁ | 0 |
| n+11 | MUL r0,r1,r0 | Multiplier | 3 |
| n+12 | LDR r3,[r7],#4 | Load | 1 |
| n+13 | CMP r0,r3 | ALU₁ | 0 |
| n+14 | B [r3] | Branch | 4 |
| n+15 | STR r0,[r0] | Store | 5 |

Fig. 2

| Instruction no. | Instruction type | | | | | T1 | T2 | T3 | T4 | T5 | T6 | T7 | T8 | T9 | T10 | | | |
|---|---|---|---|---|---|---|---|---|---|---|---|---|---|---|---|---|---|---|
| n | ALU$_1$ | F | D | E | M | W | | | | | | | | | | | | |
| n+1 | Load | | F | D | E | M | W | | | | | | | | | | | |
| n+2 | ALU$_2$ | | | F | D | E | M | W | | | | | | | | | | |
| n+3 | ALU$_2$ | | | | F | D | E | M | W | | | | | | | | | |
| n+4 | Multiplier | | | | | F | D | E | M | W | | | | | | | | |
| n+5 | Load | | | | | | F | D | E | M | W | | | | | | | |
| n+6 | ALU$_1$ | | | | | | | F | D | E | M | W | | | | | | |
| n+7 | Branch | | | | | | | | F | D | E | M | W | | | | | |
| n+8 | Store | | | | | | | | | F | D | E | M | W | | | | |
| n+9 | ALU$_1$ | | | | | | | | | | F | D | E | M | W | | | |
| n+10 | ALU$_1$ | | | | | | | | | | | F | D | E | M | W | | |
| n+11 | Multiplier | | | | | | | | | | | | F | D | E | M | W | |
| n+12 | Load | | | | | | | | | | | | | F | D | E | M | W |
| n+13 | ALU$_1$ | | | | | | | | | | | | | | F | D | E | M |
| n+14 | Branch | | | | | | | | | | | | | | | F | D | E |
| n+15 | Store | | | | | | | | | | | | | | | | F | D |

Fig. 3

| Operation segment | T1 | | Test mode | T2 | | Test mode |
|---|---|---|---|---|---|---|
| | Instruction type | Specific factor | | Instruction type | Specific factor | |
| W | ALU$_1$ | miss | 0-0 | Load | miss | 1-0 |
| M | Load | miss | 1-0 | ALU$_2$ | miss | 2-0 |
| E | ALU$_2$ | miss | 2-0 | ALU$_2$ | miss | 2-1 |
| D | ALU$_2$ | hit | 2-1 | Multiplier | hit | 3-0 |
| F | Multiplier | miss | 3-0 | Load | miss | 1-0 |

Fig. 4

DIGITAL LOGIC TEST METHOD TO SYSTEMATICALLY APPROACH FUNCTIONAL COVERAGE COMPLETELY AND RELATED APPARATUS AND SYSTEM

BACKGROUND OF INVENTION

1. Field of the Invention

The present invention relates to a digital logic test method, and more particularly, to a digital logic test method to systematically approach functional coverage completely and related apparatus and system.

2. Description of the Prior Art

About one and a half decades ago the state of the art in DRAMs was 64 k bytes, a typical personal computer (PC) was implemented with about 60 to 100 dual in-line package (DIPs), and the VAX11/780 was a favorite platform for electronic design automation (EDA) developers. Now, CPU performance and DRAM capacity have increased by more than three orders of magnitude. More complex ICs perform computation, control, and communications in myriad applications. With contemporary EDA tools, one logic designer can create complex digital designs that formerly required a team of a half dozen logic designers or more.

Though comprising fewer integrated circuits, a modern PC can still perform a variety of astonishing functions. Without any doubts, a modern integrated circuit has an inner circuit far more complicated than that of the DIP chip.

The explosive advancement of electronics technologies is not without problems. For example, digital logic test and verification present major hurdles to continued progress. In a typical digital logic test method, stimuli (called test patterns or test vectors) generated by simulators, which can be compiled or interrupted by hardware design language (HDL), are applied to the pins of a device under-test (DUT), and the response is evaluated. If we know what the expected response is from the correctly operating device, we can compare it to the response of the DUT to determine if the DUT is responding correctly. The increase in size and complexity of circuits on a chip, often with little or no increase in the number of I/O pins accordingly, creates a testing bottleneck. Much more logic functions must be controlled and observed with the same number of I/O pins, making it more difficult to test the chip. According to such a scenario, testing a chip of this size performed by logic testers approaches the amount of effort required to design it. Moreover, for some very complicated and hard to test an integrated circuit, such as a sequential circuit, the logic testers have to ask the logic designers to simplify the integrated circuit. Accordingly, a design-for-test EDA device, which has the capabilities to design and to test, comes to the market. In the process to design an integrated circuit, the logic designers have to take the testability of the integrated circuit into account seriously.

Defects may appear in a single integrated circuit sporadically or in a series of integrated circuits systematically. That the defects sporadically appears in a single integrated circuit will not bring any impact on the creditability of the company who design the integrated circuit, as long as the integrated circuit exceeds an acceptable quality level (AQL) set by the company. However, a company who designs the integrated circuit having the systematical defects may live a tough life. Therefore, new test strategies are emerging in response to test problems arising from these increasingly complex devices, and greater emphasis is placed on finding defects as early as possible in the manufacturing as well as the design cycle.

In recent years, a variety of digital logic test methods to test integrated circuits have come to the market, for example, a logic and fault simulation algorithm, an automatic test pattern generation (ATPG) designed to test combinational circuits, an iterative test generator (ITG) technique designed to test sequential circuits, and a GALloping PATern (GALPAT) technique designed to test memory, and so on. According to the variations of the test patterns these digital logic test methods apply to the DUT, a function coverage technique and a code coverage technique are two of the most popular digital logic test methods used by the logic testers.

The advantage of the code coverage technique is that it can scope a test range easily, and be applied to a register transfer level (RTL). As soon as a bug appears, the code coverage technique corrects the RTL immediately, and keeps on executing corresponding test processes. The code coverage technique can be used to measure a block coverage, an expression coverage, a path coverage, and a branch coverage, which is exclusive for a state machine.

In statistics, since the logic testers do not have the capability to design all of the test patterns a code coverage has to cover, the effectiveness of the code coverage technique is from 80 percents when testing larger modules to 90 percents when testing smaller modules. The code coverage technique with such a high effectiveness can promise nothing but a higher credibility of the integrated circuit under test at most, and whether the integrated circuit is flawless is still uncertain. Moreover, the code coverage technique lacks the capability to look for errors hidden between sub-modules.

In general, the code coverage technique is applied to a preliminary test for an integrated circuit chip, so as to find any gross deficiencies of the integrated circuit chip as early as possible. The code coverage technique analyzes a completeness of test patterns generated by a random simulator to test an integrated circuit chip. The logic designers and logic testers design a test pattern according to the characteristics of the integrated circuit chip, and read any results from the random simulator. As the number of electronic components, such as transistors and registers, is becoming larger and larger, the random simulator has to generate more complicated test patterns to test the integrated circuit chip accordingly, and in consequence, the code coverage technique analyzes the random simulator generates incomplete test patterns.

In addition to provide a test information abundant enough to cover any variations of all the variables of an integrate circuit chip precisely, a good logic test method has to acquire the test information without any difficulties. That is to say, in addition to the logic designers, who are familiar with the integrated circuit chip, anyone can design a test pattern exclusively for the integrated circuit chip easily with such a good logic test method, and acquire the test information corresponding to the integrated circuit chip after the logic test method is executed. In regard to the code coverage technique for an example, the logic designers, who have in person participated in the design of the integrated circuit chip, surely have the capability to design a test pattern to cover all the functionalities of the integrated circuit chip as completely as possible. However, imposing such a difficult task on the logic testers, who do not quite understand the integrated circuit chip, is not reasonable.

SUMMARY OF INVENTION

It is therefore a primary objective of the claimed invention to provide a digital logic test method and related apparatus and system to overcome the drawbacks of the prior art.

According to the claimed invention, the digital logic test method includes the steps of providing an integrated circuit chip capable of executing STAGE instructions during an identical period by performing STAGE operation segments having corresponding characteristics different from each other on any one of the STAGE instructions, sorting an instruction set consisting of a plurality of instructions that the integrated circuit chip can execute; and designing test patterns to test the integrated circuit chip during STAGE test segments corresponding to the STAGE operation segments respectively according to the STAGE operation segments and the sorting result of the instruction set.

According to the preferred embodiment, the digital logic test method further has the step of designing the test patterns further according to specific factors that the integrated circuit chip comprises during the STAGE test segments. Accordingly, the test patterns are $(NoIT)^{STAGE} * (f_1 * f_2 * f_3 * f_4 * f_{STAGE})$ in number, where NoIT is the sorting result of the instruction set, and $f_{STAGE}$ is the number of the specific factors that the integrated circuit chip comprises during an $f_{STAGE}$st test segment in the STAGE test segments.

According to the claimed invention, the digital logic test apparatus, which is designed to test an integrated circuit chip capable of executing STAGE instructions during an identical period by performing STAGE operation segments having corresponding characteristics different from each other on any one of the STAGE instructions, includes an instruction sorting unit for sorting an instruction set consisting of a plurality of instructions that the integrated circuit chip can execute, and for generating a sorting number, and a test pattern generator for generating test patterns to test the integrated circuit chip during STAGE test segments corresponding to the STAGE operation segments respectively according to the STAGE operation segments and the sorting number.

According to the claimed invention, the digital logic test system includes an integrated circuit chip capable of executing STAGE instructions during an identical period by performing STAGE operation segments having corresponding characteristics different from each other on any one of the STAGE instructions, and a digital logic test apparatus to test the integrated circuit chip, the digital logic test apparatus having an instruction sorting unit for sorting an instruction set consisting of a plurality of instructions that the integrated circuit chip can execute, and for generating a sorting number, and a test pattern generator for generating test patterns to test the integrated circuit chip during STAGE test segments corresponding to the STAGE operation segments respectively according to the STAGE operation segments and the sorting number.

It is an advantage of the claimed invention that the digital logic test method is capable of systematically testing all of the instructions that the integrated circuit chip can execute completely according to a finite number of operation segments having corresponding characteristics different from each other that the integrated circuit chip performs on any one of the instructions.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 2 lists a plurality of instructions and their instruction types of a program executed by a processor tested by the digital logic test method shown in FIG. 1.

FIG. 3 is a timing diagram of the digital logic test method shown in FIG. 1 when executing the program shown in FIG. 2.

FIG. 4 shows a test pattern that the digital logic test method shown in FIG. 1 generates after taking into account of an instruction cache unit hit/miss factor corresponding to an instruction-reading test segment.

DETAILED DESCRIPTION

Figure 1:
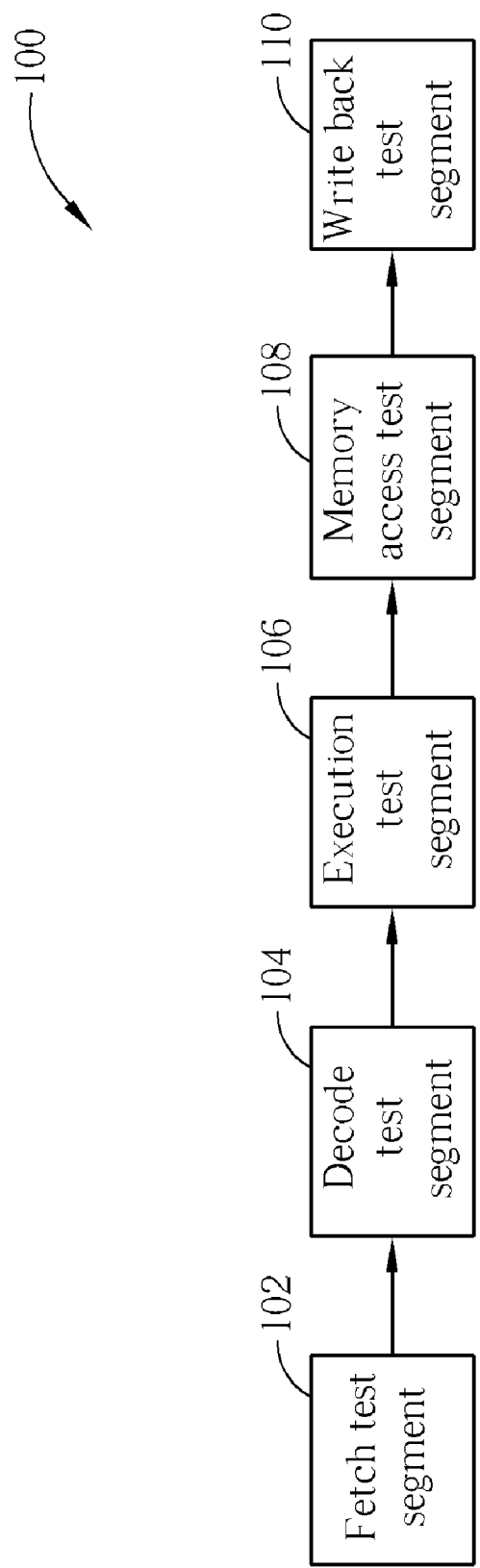
FIG. 1 is a flow chart of a digital logic test method of the preferred embodiment according to the present invention.

In order to improve the efficiency of executing instructions, a modern processor, one of the most complicated integrated circuit chips, is designed to adopt a pipeline-structured multiple instruction stream data stream system (MISD), and is therefore capable of executing a plurality of instructions during an identical period. In general, the pipeline-structured processor divides an instruction cycle into five sequentially ordered operation segments having corresponding characteristics different from each other, that is, a fetch operation segment, a decode operation segment, an execute operation segment, a memory access operation segment, and a write back operation segment. (or a fetch operation segment, a decode operation segment, an operand read operation segment, an execute operation segment, and a write back operation segment, or a fetch operation segment, an operand read operation segment, an execute operation segment, a memory access operation segment, and an operand store operation segment). The five operation segments equally share the instruction cycle, and an execution unit (EXU) of the processor is capable of decoding and executing a plurality of instructions in a program concurrently. Accordingly, a digital logic test method 100 of the present invention is designed to test the processor according to the sequentially ordered operation segments the processor has to perform when executing an instruction. Please refer to FIG. 1, which is a flow chart of the digital logic test method 100 of the preferred embodiment according to the present invention. The digital logic test method 100 comprises a fetch test segment (F) 102, a decode test segment (D) 104, an execute test segment (E) 106, a memory access test segment (M) 108, and a write back test segment (W) 110.

Generally, the EXU comprises a single-ported (or multiple-ported) general purpose register module (GPR), a special purpose register module (SPR), an arithmetic & logic unit (ALU), a multiplier, a divider, and a control logic unit for controlling data flow and instruction execution. The SPR comprises a program counter (PC) for storing an address of an instruction ready to be executed next, an instruction register for storing an instruction in execution, an address register ((can comprises a memory address register (MAR)) for indicating the address of a memory storing data (or operands) ready to be accessed, a status register, and a stack pointer register for storing an address of the top of a stack. In addition to the decoding and execution on the instructions in the program, the EXU is further capable of dealing with queue management and branch prediction.

An instruction the processor can execute can be categorized into a branch instruction type or a data processing instruction type according to whether or not a new instruction address has been stored to the PC after the instruction has been executed. The instructions of assignment, IF, and call are categorized into the branch instruction type, while the instructions of MOV, ADD, DIV, MUL, LDR, and STR are categorized into the data processing instruction type. If what the EXU of the processor decodes during the decode operation segment is a branch instruction, the EXU has to go back to the fetch operation segment, which is prior to the decode operation segment, and fetch an instruction the branch instruction indicates. The sequentially execution of instruction is therefore violated.

The processor involves a variety of hardware components when executing instructions. For example, if the EXU of the processor is executing an instruction of MOV Rx, m to move data stored in a predetermined address of a memory to a predetermined register of the processor, first the EXU transfers the address of the data to the MAR, then the processor outputs a read signal, and finally the processor stores the data it read into the predetermined register. In conclusion, the processor involves the MAR and the predetermined register as well when executing the instruction of MOV Rx, m.

According to the scenario described above, the digital logic test method of the present invention is designed not only to test the processor according to the varieties of operation segments, but also to sort the instructions in the program into a variety of instruction types according to what hardware components the instructions involve in execution.

Please refer to FIG. 2, which lists a plurality of instructions in a program executed by a processor an integrated circuit chip the digital logic test method 100 is going to test and a variety of instruction types to which the instructions belong respectively. As shown in FIG. 2, the instructions executed by the processor are assumed to be sorted into six instruction types, i.e. $ALU_1$, Load, $ALU_2$, Multiplier, Branch, and STORE being assigned serial numbers "0" to "5" respectively.

Please refer to FIG. 3, which is a timing diagram of the digital logic test method 100 when executing the program shown in FIG. 2. In regard to any instruction, for example BNE 0×100(Branch, n+7), the digital logic test method 100 has to execute the five above-mentioned test segments—F, D, E, M and W—in sequential order during five consecutive time periods, such as five time periods $T_4$ to $T_8$. On the other hand, in regard to a time period, for example a first time period $T_1$, the digital logic test method 100 executes the five test segments respectively at the same time on any five consecutive instructions, such as ADD r1, r2, r3 (ALU, n), LDR r2, [r6], #4 (Load, n+1), MOV r0, r2, LSL#0 (ALU, n+2), MOV r1, r2, LSL#1 (ALU, n+3), and MUL r0, r1, r0 (Multiplier, N+4).

It can be seen from FIG. 3 that since any instruction has to travel through exactly five test segments, and each of the test segments can have as many as six choices of instruction type, the digital logic test method 100 can provide as many as $(6*6*6*6)=NoIT^{STAGE}$ distinct test patterns, where STAGE indicates a number of instructions a pipeline-structured processor can execute in a single operation segment, and NoIT (number of instruction type) a number of instruction types to which the instructions the processor can execute belong, no matter whether any two instructions corresponding to two consecutive test patterns has a data dependency problem.

A processor (the execution unit) takes far less time in executing an instruction than in accessing a memory. In order to improve the efficiency to executing an instruction, a modern processor is designed to comprise an L.sub.1 cache memory. According to a variation in stored data, an L.sub.1 cache memory can be categorized into an instruction cache unit (ICU) designed to store instructions, and a data cache unit (DCU) designed to store data. In general, a cache memory comprises a cache controller, an SRAM as a data array, and a tag for recording an address where the data of the SRAM is located in a main memory. The cache controller determines whether the SRAM hits or misses a data by comparing an address of the data and the address stored in the tag when the processor needs to access data or instructions stored in the main memory. For example, the cache controller transfers an instruction stored in the data array to a queue of the execution unit after determining that the instruction the processor is about to execute is stored in the data array (hit), or tries to fetch the instruction from another data-storing device (an L.sub.2 cache memory or the main memory) electrically connected to the processor via a bus interface unit (miss).

The above-described cache memory is installed to improve the data-accessing efficiency of the main memory. On the other hand, a processor can access a virtual memory so as to overcome the drawback of deficiency of data storage capacity of the main memory. The processor can therefore read a page of a translation look-aside buffer (TLB) managed by a memory management unit (MMU) of the processor capable of translating a logic address to a physical and vice versa, and translate pages after a TLB page hit is determined, or do not translate pages after a TLB page fault is determined. According to the variation of stored data, the TLB can be categorized into an instruction TLB (ITLB) and a data TLB (DTLB).

During the fetch operation segment of the instruction cycle, the execution unit of the processor, together with the MMU, first transfers an address of an instruction about to be executed from the program counter to the memory address register, then outputs a read signal and updates the program counter to direct an address of an instruction next about to be executed, and last transfers the instruction fetched by the processor from a memory data register to the instruction register for decoding (the decode operation segment).

The instruction the processor has fetched can be stored originally in the ICU, in the main memory, or in the virtual memory by determining whether the instruction is ICU hit or ICU missed and whether the instruction is ITLB page hit or ITLB page fault, and the digital logic test method 100 can test, in accordance with the hit or miss determining result, the processor when operating in the fetch operation segment. For example, (1) if the instruction is determined to be ICU missed, the processor during the fetch operating segment cannot fetch the instruction from the ICU successfully, and the instruction is then determined to be TLB hit or TLB missed; (1a) If the instruction is determined to be TLB hit, the processor during the fetch operation segment can fetch the instruction from the main memory; (1b) If the instruction is determined to be TLB missed, the instruction is determined to be stored in the virtual memory. If the processor still cannot fetch the instruction from the virtual memory, a fetch error is reported; (2) On the other hand, if the instruction is determined to be ICU hit in the beginning, the processor can fetch the instruction from the ICU, without any further access to the main memory or the virtual memory, that is, without any further determination of TLB hit or TLB missed.

Accordingly, when testing the processor the digital logic test method 100 can have a variety of test modes, depending on whether the processor comprises the virtual memory, the DCU, and the ICU. In addition to the instruction types to which the instructions the processor executes belong, the digital logic test method 100, during any test segment, can further take into account specific factors the processor has during the test segment and design a more complete test pattern.

Please refer to FIG. 4, which is a test mode of the digital logic test method 100 when further taking into account a specific factor of ICU hit/missed occurring in the fetch test segment 102. Following the example shown in FIG. 3, the digital logic test method 100 can provide as many as $((6*2)*(6*2)*(6*2)*(6*2)*(6*2))=(NoIT*f_1)*(NoIT*f_2)*(NoIT*f_3)*(NoIT*f_4)*(NoIT*f_{STAGE})=(NoIT)^{STAGE}*(f_1*f_2*f_3*f_4*f_{STAGE})$ distinct test patterns, where STAGE indicates a number of instructions a pipeline-structured processor can execute in a single operation segment, NoIT a number of instruction types to which the instructions the processor can execute belong, and $f_{STAGE}$ a number of specific factors of the processor during a STAGEth test segment.

In contrast to the prior art, the present invention can provide a digital logic test method to systematically test all the instructions an integrated circuit chip can execute completely according to a finite number of operation segments having corresponding characteristics different from each other that the integrated circuit chip performs on any one of the instructions and specific factors the integrated circuit chip has during any one of the operation segments. Therefore, the digital logic test method of the present invention can systematically test the integrated circuit chip and has a functional coverage superior to that of the code coverage technique of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital logic test method comprising:
   providing an integrated circuit chip capable of executing STAGE instructions during an identical period, where STAGE is greater than 1, by performing STAGE operation segments having corresponding characteristics different from each other on any one of the STAGE instructions;
   sorting an instruction set consisting of a plurality of instructions that the integrated circuit chip can execute into a number of instruction types according to what hardware components the instructions involve in execution; and
   designing test patterns to test the integrated circuit chip during STAGE test segments corresponding to the STAGE operation segments respectively according to the STAGE operation segments and the sorting result of the instruction set;
   wherein the test patterns are $NoIT^{STAGE}$ in number, where NoIT equals the number of instruction types and is the sorting result of the instruction set.

2. The digital logic test method of claim 1 further comprising:
   designing the test patterns further according to specific factors that the integrated circuit chip comprises during the STAGE test segments.

3. The digital logic test method of claim 2 further comprising:
   providing the integrated circuit chip an instruction cache unit;
   wherein the specific factor comprises a hit/miss factor.

4. The digital logic test method of claim 2 further comprising:
   providing the integrated circuit chip a data cache unit;
   wherein the specific factor comprises a hit/miss factor.

5. The digital logic test method of claim 2 further comprising:
   providing the integrated circuit chip a memory management unit;
   wherein the specific factor comprises a TLB page fault factor.

6. A digital logic test apparatus to test an integrated circuit chip capable of executing STAGE instructions during an identical period, where STAGE is greater than 1, by performing STAGE operation segments having corresponding characteristics different from each other on any one of the STAGE instructions, the digital logic test apparatus comprising:
   an instruction sorting unit for sorting an instruction set consisting of a plurality of instructions that the integrated circuit chip can execute into a number of instruction types according to what hardware components the instructions involve in execution, and for generating a sorting number; and
   a test pattern generator for generating test patterns to test the integrated circuit chip during STAGE test segments corresponding to the STAGE operation segments respectively according to the STAGE operation segments and the sorting number;
   wherein the test pattern generator can generate $NoIT^{STAGE}$ test patterns, where NoIT equals at least the number of instruction types.

7. The digital logic test apparatus of claim 6, wherein the test pattern generator generates the test patterns further according to specific factors that the integrated circuit chip comprises during the STAGE test segments.

8. The digital logic test method of claim 7, wherein the test patterns are $(NoIT)^{STAGE}*(f_1*f_2*f_3*f_4*f_{STAGE})$ in number, where NoIT is the sorting number, and $f_{STAGE}$ is the number of the specific factors that the integrated circuit chip comprises during an $f_{STAGE}$st test segment in the STAGE test segments.

9. A digital logic test system comprising:
   an integrated circuit chip capable of executing STAGE instructions during an identical period, where STAGE is greater than 1, by performing STAGE operation segments having corresponding characteristics different from each other on any one of the STAGE instructions; and
   a digital logic test apparatus to test the integrated circuit chip, the digital logic test apparatus comprising:
      an instruction sorting unit for sorting an instruction set consisting of a plurality of instructions that the integrated circuit chip can execute into a number of instruction types according to what hardware components the instructions involve in execution, and for generating a sorting number; and
      a test pattern generator for generating test patterns to test the integrated circuit chip during STAGE test segments corresponding to the STAGE operation segments respectively according to the STAGE operation segments and the sorting number;
      wherein the test patterns are $(NoIT)^{STAGE}*(f_1*f_2*f_3*f_4*f_{STAGE})$ in number, where NoIT is the sorting number, and $f_{STAGE}$ is the number of the specific factors that the integrated circuit chip comprises during an $f_{STAGE}$st test segment in the STAGE test segments.

10. The digital logic test system of claim 9, wherein the test pattern generator of the digital logic test apparatus generates the test patterns further according to specific factors that the integrated circuit chip comprises during the STAGE test segments.

11. The digital logic test system of claim 10, wherein the integrated circuit comprises:
   an instruction cache unit;
   wherein the specific factor comprises a hit factor.

12. The digital logic test system of claim 10, wherein the integrated circuit comprises:
   a data cache unit;
   wherein the specific factor comprises a hit factor.

13. The digital logic test system of claim 10, wherein the integrated circuit comprises:
   a memory management unit;
   wherein the specific factor comprises a TLB page hit factor.

* * * * *